US009276563B2

(12) United States Patent
Bansal et al.

(10) Patent No.: US 9,276,563 B2
(45) Date of Patent: Mar. 1, 2016

(54) CLOCK BUFFERS WITH PULSE DRIVE CAPABILITY FOR POWER EFFICIENCY

(71) Applicant: INTERNATIONAL BUSINESS MACHINES CORPORATION, Armonk, NY (US)

(72) Inventors: Aditya Bansal, White Plains, NY (US); Thomas J. Bucelot, Wappingers Falls, NY (US); Alan J. Drake, Round Rock, TX (US); Phillip J. Restle, Katonah, NY (US); David W. Shan, Austin, TX (US); Mrigank Sharad, West Lafayette, IN (US)

(73) Assignee: International Business Machines Corporation, Armonk, NY (US)

( * ) Notice: Subject to any disclaimer, the term of this patent is extended or adjusted under 35 U.S.C. 154(b) by 81 days.

(21) Appl. No.: 14/303,671

(22) Filed: Jun. 13, 2014

(65) Prior Publication Data
US 2015/0365076 A1    Dec. 17, 2015

(51) Int. Cl.
*G06F 1/04*        (2006.01)
*H03K 3/012*       (2006.01)
*H03K 5/05*        (2006.01)
*H03K 5/13*        (2014.01)
*H03K 5/00*        (2006.01)

(52) U.S. Cl.
CPC .................. *H03K 3/012* (2013.01); *H03K 5/05* (2013.01); *H03K 5/13* (2013.01); *H03K 2005/00013* (2013.01)

(58) Field of Classification Search
CPC ........... H03K 3/012; H03K 5/05; H03K 5/13; H03K 5/131; H03K 5/133; H03K 5/134; H03K 5/135; H03K 5/14

USPC ......... 327/108, 109, 172, 176, 178, 179, 291, 327/299, 304; 326/82, 83, 93, 95
See application file for complete search history.

(56) References Cited

U.S. PATENT DOCUMENTS

| 7,237,217 | B2 | 6/2007 | Restle |
| 7,571,410 | B2 | 8/2009 | Restle |
| 7,719,316 | B2 | 5/2010 | Chueh et al. |
| 7,956,664 | B2 | 6/2011 | Chueh et al. |

(Continued)

OTHER PUBLICATIONS

Chan, S., et al. "A Resonant Global Clock Distribution for the Cell Broadband Engine Processor" IEEE Journal of Solid-State Circuits, vol. 44, No. 1, Jan. 2009. pp. 64-72.

(Continued)

*Primary Examiner* — William Hernandez
(74) *Attorney, Agent, or Firm* — Tutunjian & Bitetto, P.C.; Mercedes Hobson

(57) ABSTRACT

A clock driver and corresponding method are provided. The clock driver includes a multi-stage delay cell having logic circuitry and a plurality of serially connected delay elements. An input of the delay elements receives an original version of a reference clock signal input to the clock driver and used to generate a global clock signal. An output of the delay elements connects to positive and negative pulse driving branches formed from the logic circuitry. The clock driver further includes a pulse generator forming positive and negative pulse generator portions respectively connected to outputs of the positive and negative pulse driving branches. The pulse generator generates, at any given time, one of a positive pulse and a negative pulse responsive to a positive pulse enable signal and a negative pulse enable signal, respectively, and the original version of the reference clock signal input to the clock driver without modification.

20 Claims, 3 Drawing Sheets

FIG. 2

(56) References Cited

U.S. PATENT DOCUMENTS

| | | | |
|---|---|---|---|
| 8,593,183 | B2 | 11/2013 | Papaefthymiou et al. |
| 8,659,338 | B2 | 2/2014 | Papaefthymiou et al. |
| 8,704,576 | B1* | 4/2014 | Bucelot .................... G06F 1/10 327/291 |
| 2011/0140753 | A1 | 6/2011 | Papaefthymiou et al. |
| 2014/0062565 | A1* | 3/2014 | Sathe .................. H03K 19/003 327/294 |

OTHER PUBLICATIONS

Chan, S., et al. "Uniform-Phase Uniform-Amplitude Resonant-Load Global Clock Distributions" IEEE Journal of Solid-State Circuits, vol. 40, No. 1, Jan. 2005. pp. 102-109.

Chan, S., et al. "Design of Resonant Global Clock Distributions*" Proceedings of the 21st International Conference on Computer Design (ICCD'03). Oct. 2003. (6 Pages).

Chan, S., et a;. "Distributed Differential Oscillators for Global Clock Networks" IEEE Journal of Solid-State Circuits, vol. 41, No. 9, Sep. 2006. pp. 2083-2094.

Sathe, V., et al. "Resonant-Clock Design for a Power-Efficient High-Volume x86-64 Microprocessor" IEEE Journal of Solid-State Circuits, vol. 48, No. 1, Jan. 2013. pp. 140-149.

Sathe, V., et al. "Resonant-Clock Latch-Based Design" IEEE Journal of Solid-State Circuits, vol. 43, No. 4, Apr. 2008. pp. 864-873.

Xu, Z., et al. "Low-Jitter Active Deskewing Through Injection-Locked Resonant Clocking" IEEE 2007 Custom Intergrated Circuits Conference (CICC), Sep. 2007. pp. 9-12.

* cited by examiner

CLOCK BUFFERS WITH PULSE DRIVE CAPABILITY FOR POWER EFFICIENCY

TECHNICAL FIELD

The present invention relates generally to integrated circuits and, in particular, to buffers or drivers for power efficient clock distribution.

DESCRIPTION OF THE RELATED ART

Clock distributions consume significant chip power. Clock drivers with pulse drive capability can save power compared to standard non-pulsed buffers. However, conventional pulsed clock driver designs add significant clock latency in the pulsed modes. This can result in an unwanted change in clock latency causing skew to other synchronous clocks on a chip. In addition, such an increase in latency causes an increase in delay variability which can cause increased skew and jitter due to process variations and power supply noise, thus reducing chip performance.

Resonant clocking is a technique that can reduce power by using on-chip inductors for resonating the clock mesh capacitance. However, for a given mode of operation, a high-quality clock signal with maximum power saving is obtained only near the resonant frequency determined by the choice of added inductance. The power savings and the clock signal quality degrade for frequencies above and below the resonant frequency.

Further, resonant clocking provides non-uniform power savings in different resonant modes. For example, the power savings obtained for a low frequency resonant mode (selected by increasing the inductance) is significantly smaller than that for the high frequency mode (selected by decreasing the inductance). For example the low frequency mode would save 10% to 25% of the clock power from 2.0 GHz to 3.5 GHz, while the high-frequency resonant mode would save 30% to 40% of the clock power from 3.5 GHz to 5 GHz. The use of clock buffers with pulse drive capability can both increase the power savings and increase the range of frequencies where each resonant mode can be used, while maintaining better clock signal quality over an increased range of frequencies.

Prior art has shown that the use of narrow drive pulses can provide higher power saving. However, the conventional use of narrow drive pulses in the prior art has introduced additional delay and additional delay variability in the global clock signal path. This variability results in increase jitter, skew, duty-cycle variation and latency, thus adversely affecting chip performance. A variation-aware design with less added latency is thus advantageous for several reasons detailed below.

A common technique to reduce power is to use DVFS (Dynamic Voltage and Frequency Scaling) where the power supply voltage and clock frequency are dynamically changed during chip operation to optimize both performance and power as workloads and environmental conditions such as ambient temperature change. It is desirable to be able to dynamically change voltage and frequency on-the-fly, without having to stop, pause, or impact performance. To minimize power and maximize clock signal quality when voltage and frequencies are scaled, it is important to enable and disable the pulse drive mode, and adjust the pulse widths on-the-fly to avoid impacting performance. If enabling or disabling the pulse drive mode or adjusting the pulse widths reduces the clock latency, this could result in short cycles, impacting chip performance or correct function.

Further, the prior art for pulse generation circuits induced a significant latency change along with increased variability in the global clock latency, and is, thus, less suitable for on-the-fly mode changes.

There are often pairs of clock domains on an integrated circuit with frequencies that differ by the ratio of small integers that must remain synchronous. It then becomes important to minimize or control the skew or timing difference between certain clock edges in the two clock domains. Any change of latency when changing clock driver pulse mode or pulse widths makes it more difficult to maintain low skew between two clock domains. Thus a clock driver with pulse drive capability that does not cause a delay change is advantageous to maintain low skew between synchronous clock domains across all clock modes, especially when on-the-fly mode changes are needed when dynamic voltage and frequency scaling (DVFS) is used.

Pulse drive buffers can be used to save power for both resonant clock distributions as well as non-resonant clock distributions. In standard buffers, the final drive-stage of the driver is typically a simple inverter, where both the pull-up transistor and the pull-down transistor are partially on at the same time (while the input to the inverter is switching), causing wasteful cross-over or shoot-through current. In a pulsed drive buffer, the pull-up and pull-down functions are not turned on at the same time, virtually eliminating this cross-over current, which saves power for both resonant and non-resonant distributions.

In addition, pulse-drive capability can be used to control the amplitude of the driven clock signal, while maintaining faster transition times and smaller slews compared to simply controlling the drive strength of non-pulsed clock buffers. Pulse drive buffers can help achieve and control reduced swing clock signals in resonant clock distributions at a range of frequencies around each resonant frequency. In non-resonant clock distributions, pulse-drive buffers can be used to produce power-saving low-swing signals over an even wider range of frequencies, without the need for added inductance or associated resonant circuitry.

SUMMARY

According to an aspect of the present principles, a clock driver for an integrated circuit is provided. The clock driver includes a multi-stage delay cell having logic circuitry and a plurality of serially connected delay elements. An input of the plurality of delay elements is for receiving an original version of a reference clock signal input to the clock driver and used to generate a global clock signal for the integrated circuit. An output of the plurality delay elements is connected to a positive pulse driving branch and negative pulse driving branch formed from the logic circuitry. The clock driver further includes a pulse generator having pulse generation logic circuitry and transistors forming a positive pulse generator portion that is connected to an output of the positive pulse driving branch of the multi-stage delay cell and a negative pulse generator portion that is connected to an output of the negative pulse driving branch of the multi-stage delay cell. The pulse generator generates, at any given time, one of a positive pulse and a negative pulse responsive to a positive pulse enable signal and a negative pulse enable signal, respectively, and the original version of the reference clock signal input to the clock driver without modification.

According to another aspect of the present principles, a method is provided. The method includes providing, in an integrated circuit, a clock driver having a programmable pulse generator for generating, at any given time, one of a positive pulse and a negative pulse. The providing step includes configuring the programmable pulse generator to generate, at the any given time, one of the positive pulse and the negative pulse responsive to a positive pulse enable signal and a negative pulse enable signal, respectively, and an original version of a reference clock signal input to the clock driver without any duty-cycle variation. The providing step further includes configuring a width of the positive pulse and the negative pulse generated at the any given time by the programmable pulse generator responsive to at least one of different frequencies and different power supply voltages.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present principles are directed to power reduction in clock distributions for integrated circuits using clock drivers with pulse drive capability without increasing clock latency, variability, or skew between clock domains. In an embodiment, a dynamic pulsed sector buffer design is advantageously provided that incorporates a programmable pulse generation circuit for generating narrow drive pulses without adding any additional variability to the global clock in the form of jitter, skew, latency or duty-cycle variations. In an embodiment, this new pulsed resonant clock driver advantageously saves power by having both pulsed and non-pulsed modes, and does not increase clock latency, thus reducing skew and jitter problems. Further, this pulsed resonant clock driver can be disabled or enabled, to allow tuning of the total drive strength when multiple circuits are used to drive the same clock capacitance. Further, in an embodiment, the present principles advantageously provide on-the-fly mode change.

Figure 1:
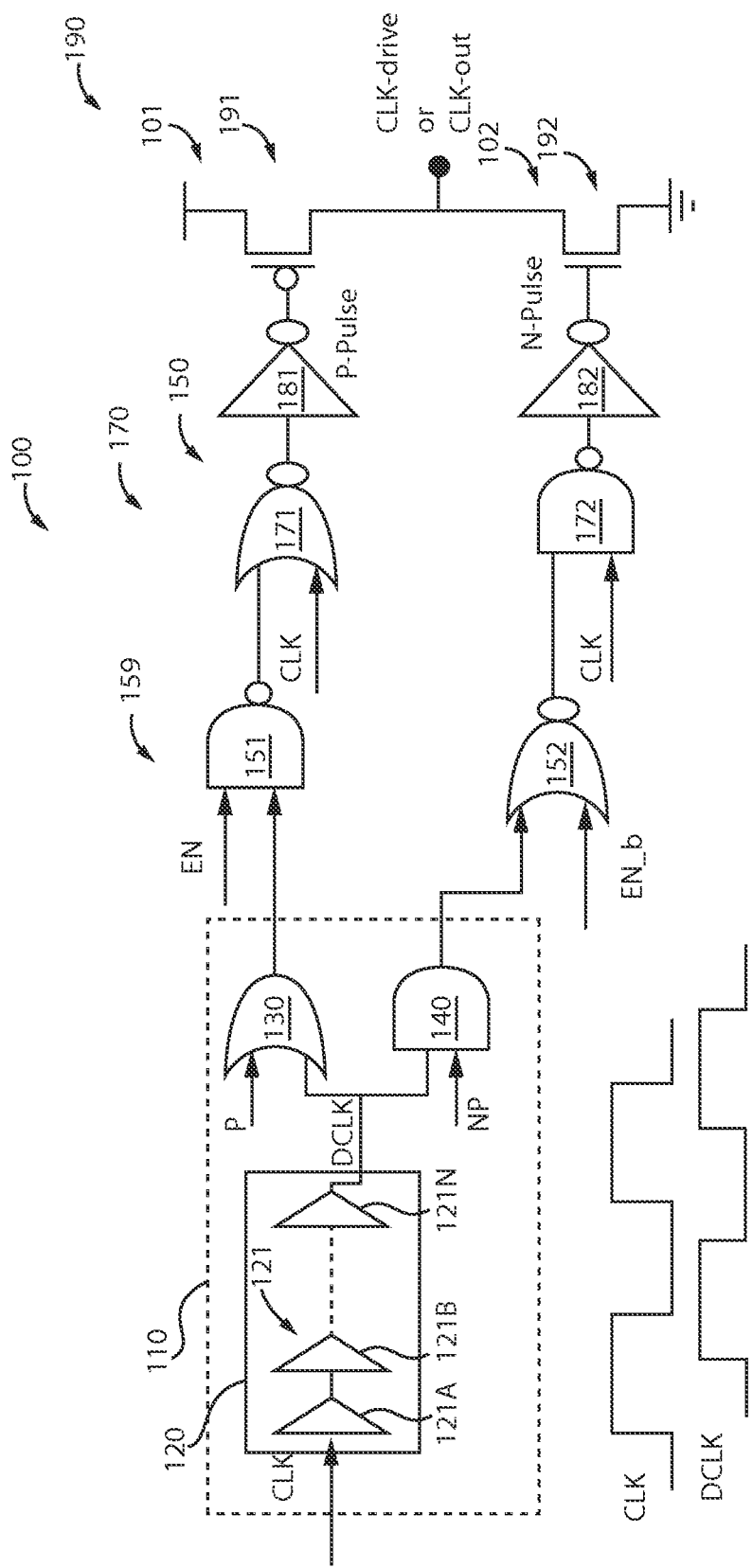
FIG. 1 shows a low-skew, variation aware sector buffer circuit 100, in accordance with an embodiment of the present principles.

FIG. 1 shows a low-skew, variation aware sector buffer circuit 100, in accordance with an embodiment of the present principles. In an embodiment, the buffer circuit 100 can be used with a non-resonant clock. In another embodiment, the buffer circuit 100 can be with a resonant clock.

The low-skew, variation aware sector buffer circuit 100 includes a multi-stage delay cell 110. The multi-stage delay cell 110 includes a delay element 120, an OR gate 130, and an AND gate 140. The OR gate 130 forms a positive pulse driving branch and the AND gate 140 forms a negative pulse driving branch of the multi-stage delay cell 110.

The delay element 120 includes a group 121 of one or more delay buffers 121A through 121N connected in series. The input of the delay element 120 is connected to the input of the first delay buffer 121A in the group 121, and receives a reference clock signal CLK. The output of the delay element 120 is connected to the output of the last delay buffer 121N, which provides a delayed version of the reference clock signal CLK. The delayed version of the reference clock signal CLK is interchangeably referred to herein as "delayed clock" and/or "DCLK". The waveform of the delayed clock is shown in FIG. 1 relative to the waveform of the reference clock signal CLK.

The output of the delay element 120 is also connected to a first input of the OR gate 130 and to a first input of the AND gate 140. A second input of the OR gate 130 receives an input signal P. When the signal P is high (and the complement signal NP is low), this enables the pulse-mode operation. Conversely, when the signal P is low (and NP is high) the sector buffer reverts to non-pulsed operation. A second input of the AND gate 140 receives a signal NP, which is the complement of the P signal.

The low-skew, variation aware sector buffer circuit 100 further includes a pulse generator 170. The pulse generator 170 includes a set of logic gates 171, 172, 181, and 182. The output drive portion consists of a set of transistors 191 and 192. The set of logic gates 151 and 152 includes a NAND gate 151 and an NOR gate 152.

The NAND gate 151 and the NOR gate 152 can be considered an enable/disable portion 159 of the sector buffer 100. In this way, for multiples of the circuit 100 implemented throughout an IC, the enable/disable portion 159 can enable or disable one or more sections 100 of sector buffer section. For example a tunable sector buffer (not shown) can be created by combining a number of these low-skew sector buffers connected in parallel, so that the strength of the larger tunable sector buffer can be controlled using the individual EN and EN_b signals.

In the embodiment of FIG. 1, the transistor 191 is an enhancement-mode P-channel field-effect transistor, and the transistor 192 is an enhancement-mode N-channel field-effect transistor. Of course, the present principles are not limited to the preceding channel configurations, transistor types, and so forth and, thus, other channel configurations, transistor types, and so forth can also be used in accordance with the teachings of the present principles, while maintaining the spirit of the present principles.

The output of the OR 130, which is a first output of the multi-stage delay cell 110, is connected to a first input of the NAND gate 151. A second input of the NAND gate 151 receives an enable signal EN. An output of the NAND gate 151 is connected to a first input of the NOR gate 171. A second input of the NOR gate 171 is connected to the reference clock signal CLK. An output of the NOR gate 171 is connected to an input of the inverter 181. An output of the inverter 181 is connected to a gate of transistor 191. A source of the transistor 191 is connected to a pull-up voltage. A drain of the transistor 191 is connected to a drain of the transistor 192.

The output of the AND gate 140, which is a second output of the multi-stage delay cell 110, is connected to a first input of the NOR gate 152. A second input of the NOR gate 152 receives an enable signal EN_b. An output of the NOR gate 152 is connected to a first input of the NAND gate 172. A second input of the NAND gate 172 is connected to the reference clock signal CLK. An output of the NAND gate 172 is connected to an input of the inverter 182. An output of the inverter 182 is connected to a gate of the transistor 192. A source of the transistor 192 is connected to ground voltage.

The output of the low-skew, variation aware sector buffer circuit 100 is taken at the common connection point of the drains of the transistors 191 and 192, and is designated in FIG. 1 as "CLK-drive or CLK-out".

The NAND gate 151, the NOR gate 171, the invertor 181, and the transistor 191 form a P-pulse generator portion 101 of the pulse generator 170. The NOR gate 152, the NAND gate 172, the invertor 182, and the transistor 192 form an N-pulse generator portion 102 of the pulse generator 170. When pulse-mode is enabled by the P and NP signals, and the drive circuit is enabled using the EN and EN_b signals, these pulse-generator circuits combine the CLK signal with the delayed clock DCLK to produce the desired pulsed-drive.

The low-skew, variation aware sector buffer circuit 100 advantageously does not add any additional circuitry to the path of critical pulse edges, thereby mitigating the impact of variability in the narrow pulse shapes on the global clock waveform. Specifically, the circuit delay from CLK to CLK-out is almost unchanged regardless of whether pulse drive is enabled by setting the P high and it's complement NP low.

The low-skew, variation aware sector buffer circuit 100 advantageously does not add any additional latency to the critical pulse edge thereby facilitating on the fly mode change.

Figure 2:
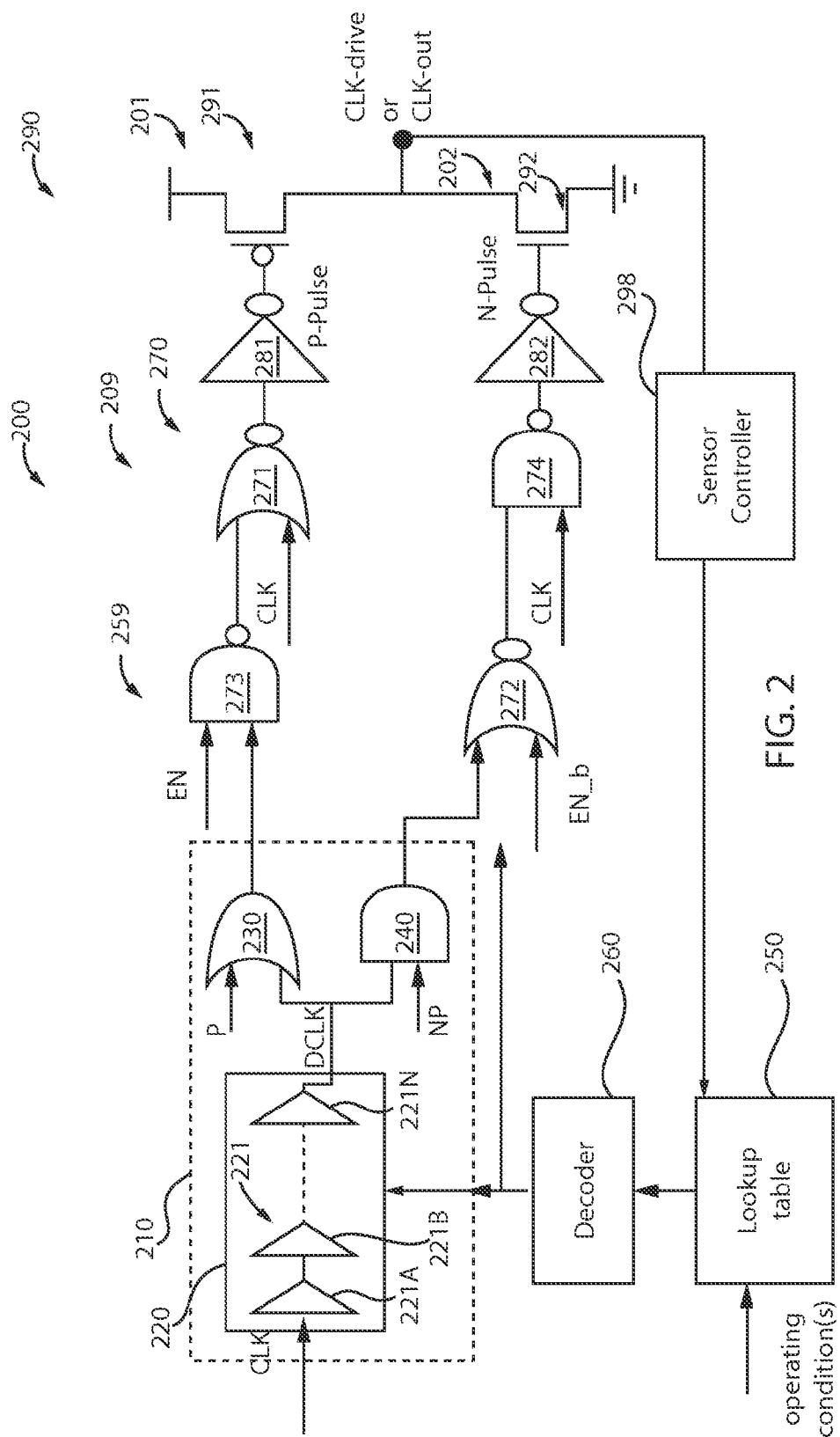
FIG. 2 shows a dynamic pulsed sector buffer circuit 200, in accordance with an embodiment of the present principles.

FIG. 2 shows a dynamic pulsed sector buffer circuit 200, in accordance with an embodiment of the present principles. In an embodiment, the buffer circuit 200 can be used with a non-resonant clock. In another embodiment, the buffer circuit 200 can be with a resonant clock.

In comparison to the low-skew, variation aware sector buffer circuit 100 of FIG. 1, the dynamic pulsed sector buffer circuit 200 of FIG. 2 adds the capability of changing pulse widths and enable signals for different frequencies and/or power supply voltages, using a table (e.g., a look up table 250), or a controller with a suitable algorithm and a decoder 260 as described below to decide what buffer strength and what pulse width to use for each operation condition.

The dynamic pulsed sector buffer circuit 200 includes a multi-stage delay cell 210. The multi-stage delay cell 210 includes a delay element 220, an OR gate 230, and an AND gate 240. The OR gate 230 forms a positive pulse driving branch and the AND gate 240 forms a negative pulse driving branch of the multi-stage delay cell 210.

The delay element 220 includes a group 221 of one or more delay buffers 221A through 221N connected in series. The input of the delay element 220 is connected to the input of the first delay buffer 221A in the group 221, and receives a reference clock signal CLK. The output of the delay element 220 is connected to the output of the last delay buffer 221N, which provides a delayed version of the reference clock signal CLK. The delayed version is referred to herein as "DCLK", as is shown in FIG. 1.

The output of the delay element 220 is also connected to a first input of the OR gate 230 and to a first input of the AND gate 240. A second input of the OR gate 230 receives an input signal P. When the signal P is high (and the complement signal NP is low), this enables the pulse-mode operation. Conversely, when the signal P is low (and NP is high) the sector buffer reverts to non-pulsed operation. A second input of the AND gate 240 receives a signal NP, which is the complement of the P signal.

The dynamic pulsed sector buffer circuit 200 also includes a lookup table 250 and a decoder 260. The lookup table 250 receives an input signal representative of, or specifying, an operating condition(s) and provides a corresponding decodable value(s) thereto for use by the decoder 260. The operating condition(s) can include, e.g., but is not limited to, the frequency of the reference clock signal CLK, some other frequency (e.g., set by an inductor or other device), power supply voltages, and so forth. The decoder 260 receives and decodes the corresponding value(s) and responsive thereto outputs control signals to the multi-stage delay cell 210 and in order to control a the delay of the multi-stage delay cell 210 which in turn adjusts the pulse width of the positive pulse and/or the negative pulse (depending upon which is enabled) generated by the pulse generator. In addition, the decoder can be connected to the enable signals EN and EN_b to adjust the total drive strength when multiple copies of this pulse-drive sector buffer circuit are used to drive the same clock load capacitance.

The dynamic pulsed sector buffer circuit 200 further includes a set of logic gates 270 and a set of transistors 290. The set of logic gates 270 includes an NOR 271, an NOR gate 272, a NAND gate 273, a NAND gate 274, an inverter 281 and an inverter 282. The set of transistors 290 include a transistor 291 and a transistor 292.

The NAND gate 273 and the OR gate 272 can be considered an enable/disable portion 259 of a pulse generator 209. In this way, for multiples of the circuit 200 implemented throughout an IC, the enable/disable portion 259 can enable or disable the pulse generator 209 for a particular area (clock grid portion) of the IC.

In the embodiment of FIG. 2, the transistor 291 is an enhancement-mode P-channel field-effect transistor, and the transistor 292 is an enhancement-mode N-channel field-effect transistor. Of course, the present principles are not limited to the preceding channel configurations, transistor types, and so forth and, thus, other channel configurations, transistor types, and so forth can also be used in accordance with the teachings of the present principles, while maintaining the spirit of the present principles.

The output of the OR 230, which is a first output of the multi-stage delay cell 210, is connected to a first input of the NAND gate 273. A second input of the NAND gate 273 receives an enable signal EN. An output of the NAND gate 273 is connected to a first input of the NOR gate 271. A second input of the NOR gate 271 is connected to the reference clock signal CLK. An output of the NOR gate 271 is connected to an input of the inverter 281. An output of the inverter 281 is connected to a gate of transistor 291. A source of the transistor 291 is connected to a pull-up voltage. A drain of the transistor 291 is connected to a drain of the transistor 292.

The output of the AND gate 240, which is a second output of the multi-stage delay cell 210, is connected to a first input of the NOR gate 272. A second input of the NOR gate 272 receives an enable signal EN_b. An output of the OR gate is connected to a first input of the NAND gate 274. A second input of the NAND gate 274 is connected to the reference clock signal CLK. An output of the NAND gate 274 is connected to an input of the inverter 282. An output of the inverter 282 is connected to a gate of the transistor 292. A source of the transistor 292 is connected to ground voltage.

The output of the dynamic pulsed sector buffer circuit 200 is taken at the common connection point of the drains of the transistors 291 and 292, and is designated in FIG. 2 as "CLK-drive or CLK-out". The output of the dynamic pulsed sector buffer circuit 200 is fed to a sensor controller 298. The sensor controller 298 comprises circuits configured to be sensitive to any of a variety of clock waveform characteristics such as, but not limited to, slew, amplitude, delay of receiving gates, and delay difference/variation between two types of receiving gates. In an embodiment, the output of the sensor controller 298 includes information for adjusting pulse widths and/or drive strength. This information is then received by the LUT 250.

The NAND gate 273, the NOR gate 271, the invertor 281, and the transistor 291 form a P-pulse generator portion 201 of a programmable pulse generator 209. The NOR gate 272, the NAND gate 274, the invertor 282, and the transistor 292 form an N-pulse generator portion 202 of the pulse generator 209.

Regarding the enable signal EN and the enable signal EN_b, in an embodiment, when multiple copies of this pulse-drive sector buffer are used to drive the same clock load capacitance, the EN and EN_b enable signals, which are normally complementary signals are independently generated to adjust the clock duty cycle. The enable signal EN when HI enables the transistor 291 to pull-up the CLK-out output for a pulse period controlled by the programmable delay 220 and the pulse-enable signals P and NP. When EN is low, transistor 291 is never turned on, and it's pull-up function is disabled, which would be used to reduce the fraction of time that the clock load driven by CLK-out is high, reducing clock duty cycle. Conversely, the enable signal EN can be used to independently reduce the fraction of time that the clock load driven by CLK-out is low, increasing clock duty cycle.

Regarding the reference clock signal CLK, the same is used by the dynamic pulsed sector buffer circuit 200 unmodified with a duty cycle of fifty percent.

The dynamic pulsed sector buffer circuit 200 advantageously allows both frequency dependent pulse width tuning and sector buffer sizing when multiples of these variation aware sector buffers circuits are used with independent EN and EN_b signals as described below.

The dynamic pulsed sector buffer circuit 200 advantageously does not add any additional circuitry to the path of critical pulse edges, thereby mitigating the impact of variability in the narrow pulse shapes on the global clock waveform.

The dynamic pulsed sector buffer circuit 200 advantageously does not add any additional latency to the critical pulse edge thereby facilitating on the fly mode change.

Further regarding both the low-skew, variation aware sector buffer circuit 100 and the dynamic pulsed sector buffer circuit 200, there can multiples of these circuits configured in a parallel configuration in a chip. Thus, FIG. 1 essentially shows, e.g., the respective "N$^{th}$" section of the entire buffer that includes the circuit 100, and FIG. 2 essentially shows, e.g., the respective "N$^{th}$" section of the entire buffer that includes the circuit 200. The number of these sections that are enabled can be adjusted using the enable signals EN and EN_b. Such adjustment effectively adjusts the strength of the total drive. The EN_b signals are the negative of the EN signals.

In an embodiment, the low-skew, variation aware sector buffer circuit 100 and/or the dynamic pulsed sector buffer circuit 200 can used in a clock distribution network that includes a clock grid having a plurality of sectors for providing the global clock signals to various chip locations. In an embodiment, the clock distribution network can further include a buffered clock tree for driving the clock grid, the tree including at least a root and a plurality of clock buffers. In an embodiment, a number of sector buffers can be distributed (e.g., uniformly or non-uniformly) over the clock grid and used to drive a final clock grid and each sector buffer is placed in an area (e.g., but not limited to, the middle of, or other location in, a small rectangular (or square or other shaped) area of the grid called a clock sector. In contrast, a relay buffer is primarily used to relay and/or otherwise distribute the clock signal throughout the chip with the same latency in order to drive the inputs of all the sector buffers in a synchronous, low-skew manner.

In an embodiment involving resonant clocking, the pulse driven sector buffer is connected to, and drives, a clock grid (or clock grid portion) having one or more inductors, the inductor resonating a clock capacitance of the clock grid (or a portion of this capacitance).

Additionally, while FIG. 2 shows and described lookup table 250, any array can be used where an input is mapped to an output, the output being provided to the decoder 260 for use as described herein.

Further, the pulse generator 170 of FIG. 1 and the pulse generator 209 of FIG. 2 advantageously provide independent adjustment of at least one of pull-up or pull-down drive strength to adjust clock waveform characteristics such as clock duty-cycle, clock signal amplitude, clock signal slew, clock skew.

Figure 3:
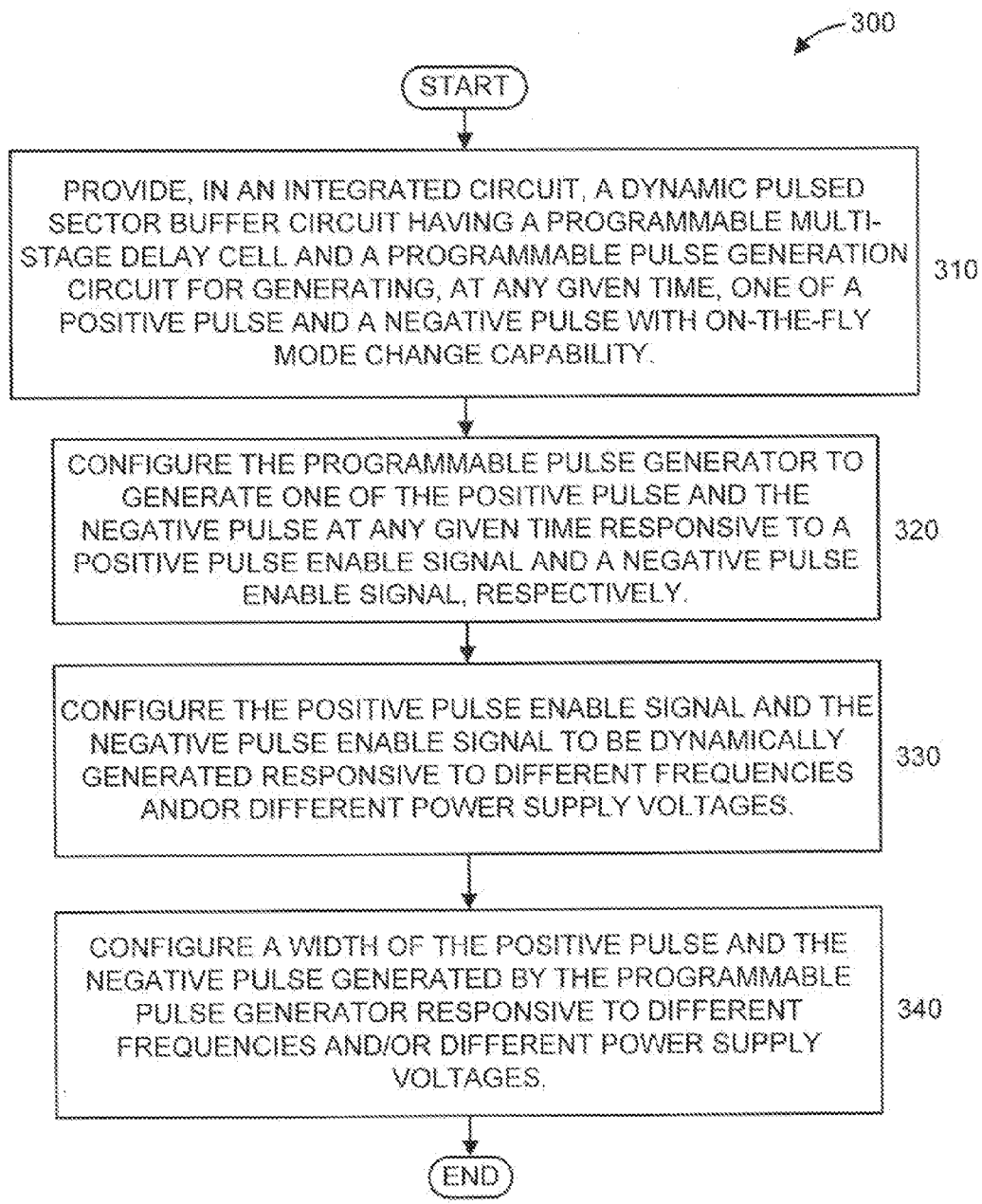
FIG. 3 shows a method 300 for dynamic pulsed sector buffering, in accordance with an embodiment of the present principles.

FIG. 3 shows a method 300 for dynamic pulsed sector buffering, in accordance with an embodiment of the present principles.

At step 310, provide, in an integrated circuit, a dynamic pulsed sector buffer circuit having a programmable multi-stage delay cell and a programmable pulse generation circuit for generating, at any given time, one of a positive pulse and a negative pulse, with on-the-fly mode change (positive to negative and vice versa) capability.

In an embodiment, step 310 can include steps 320, 330, and 340 as follows.

At step 320, configure the programmable pulse generator to generate one of the positive pulse and the negative pulse at any given time responsive to a positive pulse enable signal and a negative pulse enable signal, respectively.

At step 330, configure the positive pulse enable signal and the negative pulse enable signal to be dynamically generated responsive to different frequencies and/or different power supply voltages.

At step 340, configure a width of the positive pulse and the negative pulse generated by the programmable pulse generator responsive to different frequencies and/or different power supply voltages. These frequencies and voltages can be the same as those mentioned in step 330 or different there from. In an embodiment, the range of frequencies is specified in a look up table (LUT). In an embodiment, the range of frequencies is determined relative to a resonant frequency, in the case of a resonant clock distribution. The resonant frequency is determined by the product of the inductance and capacitance being driven by the inductance. Specifically the resonant frequency is approximately proportional to the inverse of the square-root of the product of the inductance and the clock capacitance. The widths are generated to be narrow, and to not add variability to the reference clock signal in the form of jitter, skew, latency, and duty-cycle variations.

It is to be appreciated that the frequency dependent pulse width tuning in accordance with the present principles can provide substantially uniform power savings over a wider range of frequencies for a given choice of inductor, in contrast to the prior art. For example without pulse-width tuning, a resonant clock design might save a maximum of 35% of the clock power at a 4 GHz resonant frequency, and maintain three quarters of this power savings over a frequency range of 3.5 GHz to 4.5 GHz, while maintaining a good clock signal quality that avoids any degradation in the maximum clock frequency and chip performance achievable. The addition of pulse-drive capability can extend this frequency range and increase the maximum power savings from 35% to 40%, while also increasing the range of frequencies achieving three quarters of this power savings to a wider range from 3.2 GHz to 5 GHz, again without sacrificing clock signal quality or performance. Moreover, the combination of pulse width tuning and sector buffer downsizing in accordance with the present principles can further enhance the power savings obtained from resonant clocking.

To take full advantage of clock drivers with pulse drive capability, it is important to correctly decide when to disable and enable the pulse drive mode, and to choose the optimal pulse widths if multiple pulse widths are available. As conditions change such as chip temperature, device aging, and DVFS, it may be important to dynamically change pulse widths as well as drive strength of the clock drivers. To optimally choose pulse widths, a method of measuring the quality of the clock signals is desirable. Specific sensor circuits can be designed to be sensitive to well-known waveform properties such as signal amplitude, clock slew, clock skew, voltage overshoot and undershoot, etc., and the results can be used in a sensor based control system to maximize power savings while maintaining clock quality. However, it is very difficult to decide exactly what clock signal properties are the most important, and even if the important waveform properties are known, it is difficult to know what combination of properties are actually required for the optimal function of a specific clock distribution. This is complicated by the fact that the average device characteristics vary from chip to chip, and individual devices vary from these means within every chip. To solve these problems, a sensor circuit can be designed based on the actual circuits that use the clock signal. Specifically, the clock quality sensor circuit proposed starts with an exact copy of one of the local clock blocks (LCBs) that are the circuits that receive the global clock signal for functional purposes. This nominal LCB circuit can then be modified to remove unneeded functions or devices, producing a simpler nominal-LCB-sense circuit representing the important features of one of the normal LCB circuits actually used in the product. Next, one or more copies of this LCB-sense circuit is created by changing detailed parameters of key devices, designed to mimic the maximum likely variation possible between different LCBs due to on-chip device variability. For example, if it is known that device-width variability could be as much as 10% between devices on the same chip, one LCB-sense copy could be designed with key devices 10% wider, for example, to produce a fast-LCB-sense. The nominal-LCB-sense circuit and the fast-LCB-sense circuit would both be connected to the global clock distribution to be measured. Then the output of both fast and slow LCB-sense circuits would be connected to a time-to-digital converter, with outputs representing the delay difference between the nominal and fast LCB-sense circuits. To measure very small timing differences, the time-to-digital converter (TDC) could be constructed from one or more arbiter circuits that simply measure which of two signals arrives first. The input of each arbiter would then be delayed by different length wires, or the same length wires with different capacitive loading, to produce small but predictable delays differences to the input of each arbiter. Many other ways of producing predictable delay differences and TDCs are well known. The outputs of several different kinds of fast and slow LCB-sense circuits could be easily designed to be sensitive to global clock quality just like the variable LCBs on a product. Hardware testing results on a number of actual chips could then be used to decide and calibrate which LCB-sense circuits should be used as inputs to a controller to choose the clock driver pulse-width settings, and/or driver strength settings.

The terminology describing the timing characteristics of clock signals is not well standardized, so it is important to define the terminology used in this document, especially where it differs from related art. The term duty cycle for a signal is usually defined as the fraction of time a signal is high. This can be generalized to mean the fraction of time a signal or function is on or active, where on or active can refer to either high or low voltage depending on context. Thus, the multiple meanings of the term duty cycle can cause confusion. In this work, the term duty cycle is used only to refer to either the single input clock signal (used as the timing critical primary input signal to a clock buffer), or the single output signal node of the clock buffer. In the case where the single input clock is modified to produce more than one signal by modifying the single input clock signal, we do not use the term duty cycle to describe the properties of these multiple clock signals. Instead we use the term pulse width to describe the active width of these two signals. In one prior art approach, the term duty cycle is used to describe the reduced active time of the two modified clock signals, which are then used as two timing critical inputs to a clock buffer, where one modified signal is used to pull-up the buffer output for an optionally short period of time, and the other differently modified signal is used to pull down the buffer output for an optionally short period of time. Note that even when both these pull-up and pull-down signals are active for a short time, as long as they are the same short time, then the duty cycle of the single output clock can be unaffected. Thus to avoid confusion, in this document, we use the term pulse width to describe the characteristics of the two signals used to control the pull-up time and the pull-down time of the clock buffer. We reserve the term duty-cycle to refer to the single unmodified input or reference clock signal, and the single output signal of a clock buffer.

Note that a key feature of our pulse drive enabled buffers is that the critical delay of the buffer, which should be measured from the single clock input or reference clock, to the single clock output node is unaffected by the circuits used to allow the pulse drive capability, and this is a key differentiator from the previous art.

A description will now be given of some of the many attendant advantages of the proposed pulsed resonant clocking in accordance with the present principles. Of course, one of ordinary skill in the art will readily appreciate these and various other advantages, given the teachings of the present principles provided herein.

One advantage of the pulsed resonant clocking is higher power savings in the resonant mode as compared to the prior art.

Another advantage is the ability to maximize the resonant mode power savings over a wider range of frequencies by using adjustable pulse-widths for the pulse-drive.

Another advantage is to optimize power savings over a wider frequency range through the adjustment of pulse-width and drive strength as a function of frequency and power supply voltage to maintain the required clock signal quality including parameters such as duty-cycle, slew, amplitude, and skew.

Still another advantage is enhanced power savings by combining the use of narrow drive pulses with sector buffer downsizing.

Another advantage is allowing chip-specific tuning of sector buffer pulse-widths and/or drive strength to optimize the power and functionality of chips having different manufacturing induced process variations.

A description will now be given of some of the many attendant advantages of the proposed sector buffer design in accordance with the present principles. Of course, one of ordinary skill in the art will readily appreciate these and various other advantages, given the teachings of the present principles provided herein.

One advantage of the sector buffer design is in providing both frequency dependent pulse width tuning and sector buffer sizing. Another advantage is the lack of having to add any additional circuitry to the path of critical pulse edges, thereby mitigating the impact of variability in the narrow pulse shapes on the global clock waveform. Yet another advantage is the introduction of minimal additional latency/delay to the global clock waveform. Still another advantage is the preservation and control of the duty cycle, slew, and amplitude of the mesh clock. Moreover, another advantage is the amenability to on the fly mode change.

Thus, the present principles advantageously address and overcome the problem of how to improve the power savings obtained from resonant clocking and how to obtain uniform power savings for a wide range of frequencies, in both resonant clock distribution and non-resonant clock distributions. The significance of the present principles is readily recognized by one of ordinary skill in the art. For example, depending upon the implementation, global clocking can account for up to approximately ten to twenty-five percent of microprocessor power and, hence, it is important to improve the resonant clocking scheme for enhanced power saving in the global clocking network for a target frequency range. These and other advantages of the present principles are readily recognized by one of ordinary skill in the art, given the teachings of the present principles provided herein.

A description will now be given regarding some of the significant differences of the present principles from the prior art. Of course, one of ordinary skill in the art will readily appreciate these and various other differences, given the teachings of the present principles provided herein.

One difference is that the present principles improve the peak power savings achievable from resonant clocking from approximately 35% percent to approximately 40% percent (compared to a standard non-resonant full-swing clock distribution). Another difference is that the proposed method can provide "near" uniform power savings over a wider frequency range (for a given inductor), whereas in the prior art the power savings dropped more quickly as we move away from the "resonant frequency". Yet another difference is that the proposed circuit for pulsed clocking introduces minimal additional skew, jitter and duty cycle variation over the non-pulsed design, whereas the prior art for pulsed clocking introduces larger variability in pulsed mode. Still another difference is that the proposed scheme introduces minimal additional latency to the global clock and, hence, is amenable to on the fly mode change, whereas the prior art introduces a large latency increase in pulsed-mode, thereby making operation in both modes difficult in a system where multiple clock domains must remain synchronized with low skew. In addition, any change in latency makes on-the-fly mode-change more challenging since any latency reduction will cause short cycles and thus performance degradation.

Among many possible applications, the present principles can be applied, but are not limited to, game-chip designs, Application Specific Integrated Circuit (ASIC) designs, research consulting, and so forth The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A clock driver for an integrated circuit, comprising
a multi-stage delay cell having logic circuitry and a plurality of serially connected delay elements, an input of the plurality of delay elements for receiving an original version of a reference clock signal input to the clock driver and used to generate a global clock signal for the integrated circuit, and an output of the plurality delay elements connected to a positive pulse driving branch and a negative pulse driving branch formed from the logic circuitry; and
a pulse generator having pulse generation logic circuitry and transistors forming a positive pulse generator portion that is connected to an output of the positive pulse driving branch of the multi-stage delay cell and a negative pulse generator portion that is connected to an output of the negative pulse driving branch of the multi-stage delay cell,
wherein the pulse generator generates, at any given time, one of a positive pulse and a negative pulse responsive to a positive pulse enable signal and a negative pulse enable signal, respectively, and the original version of the reference clock signal input to the clock driver without modification.

2. The clock driver of claim 1, wherein the clock driver is applied in a non-resonant clock distribution.

3. The clock driver of claim 1, wherein the clock driver is applied in a resonant clock distribution.

4. The clock driver, of claim 1, wherein the clock driver is connected to a clock grid having one or more inductors, the one or more inductors resonating a clock capacitance of the clock grid.

5. The clock driver of claim 4, wherein a pulse mode capability of the clock driver is selectively disabled.

6. The clock driver of claim 5, wherein a dynamic generation of the positive pulse enable signal or the negative pulse enable signal is responsive to at least one of different frequencies and different power supply voltages.

7. The clock driver of claim 1, wherein pulse widths of the positive pulse and the negative pulse are controlled by a programmable delay element, a programmable delay of the programmable delay element being responsive to a given frequency or given frequency range.

8. The clock driver of claim 7, wherein power consumption of the clock driver is minimized by adjusting the programmable delay and the pulse enable signals responsive to frequency or voltage changes.

9. The clock driver of claim 1, wherein the pulse generator generates the positive pulse and the negative pulse without any increase in jitter, skew, and latency and without any duty-cycle variation.

10. The clock driver of claim 1, wherein the clock driver comprises a plurality of clock drivers having respective pulse drive sector buffers located in a common clock distribution, and respective pulse generators of the plurality of clock drivers generate respective positive pulses and negative pulses without any increase in jitter, skew, duty-cycle variation and latency with respect to each other.

11. The clock driver of claim 1, wherein pulse widths of the positive pulse and the negative pulse are controlled by a preset delay of the multi-stage delay cell.

12. The clock driver of claim 1, wherein the clock driver comprises a plurality of clock drivers configured to drive a common capacitance, wherein individual enable signals are used to control each individual one of the plurality of clock drivers to control a total drive strength driving the common capacitance.

13. The clock driver of claim 12, wherein respective pulse generators in the plurality of clock drivers are programmable pulse generators generating positive pulses and negative pulses with programmable pulse widths.

14. The clock driver of claim 13, further comprising:

an array; and a decoder, wherein the array receives indicia representative of different frequencies and different power supply voltages and provides decoded signals responsive thereto to the decoder, the decoder outputting control signals for adjusting the buffering strength and the pulse width responsive to the decoded signals.

15. The clock driver with pulse drive capability of claim 1, wherein the pulse generator provides independent adjustment of at least one of a pull-up drive strength, a pull-down drive strength, a pull-up pulse width, and a pull-down pulse width, to adjust power or clock waveform characteristics.

16. A method, comprising:

providing, in an integrated circuit, a clock driver having a programmable pulse generator for generating, at any given time, one of a positive pulse and a negative pulse, wherein said providing step comprises:

configuring the programmable pulse generator to generate, at the any given time, one of the positive pulse and the negative pulse responsive to a positive pulse enable signal and a negative pulse enable signal, respectively, and an original version of a reference clock signal input to the clock driver without any duty-cycle variation; and configuring a width of the positive pulse and the negative pulse generated at the any given time by the programmable pulse generator responsive to at least one of different frequencies and different power supply voltages.

17. The method of claim 16, further comprising configuring the clock driver, including the programmable pulse generator, to generate the positive pulse and the negative pulse at the any given time, using an unmodified duty cycle of a reference clock used to generate a global clock signal for the integrated circuit.

18. The method of claim 16, wherein the positive pulse enable signal and the negative pulse enable signal are dynamically generated with independently adjustable duty cycles.

19. The method of claim 16, wherein a dynamic generation of the positive pulse enable signal and the negative pulse enable signal is responsive to at least one of the different frequencies and the different power supply voltages.

20. The method of claim 16, wherein the clock driver is provided with a multi-stage delay cell, and the method further comprises configuring a buffering strength of the multi-stage delay cell responsive to at least one of the different frequencies and the different power supply voltages.

* * * * *